US008319302B2

(12) United States Patent
Zhang et al.

(10) Patent No.: US 8,319,302 B2
(45) Date of Patent: Nov. 27, 2012

(54) WAFER ARRANGEMENT AND A METHOD FOR MANUFACTURING THE WAFER ARRANGEMENT

(75) Inventors: Qingxin Zhang, Singapore (SG); Guo-Qiang Patrick Lo, Singapore (SG); Mingbin Yu, Singapore (SG); Dim-Lee Kwong, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 228 days.

(21) Appl. No.: 12/665,876

(22) PCT Filed: Aug. 8, 2007

(86) PCT No.: PCT/SG2007/000243
§ 371 (c)(1),
(2), (4) Date: May 4, 2010

(87) PCT Pub. No.: WO2009/002271
PCT Pub. Date: Dec. 31, 2008

(65) Prior Publication Data
US 2010/0219496 A1    Sep. 2, 2010

Related U.S. Application Data

(60) Provisional application No. 60/945,660, filed on Jun. 22, 2007.

(51) Int. Cl.
*H01L 31/02* (2006.01)

(52) U.S. Cl. ........ 257/432; 257/414; 257/415; 257/431; 257/E31.11
(58) Field of Classification Search .......... 257/414–432, 257/E31.11
See application file for complete search history.

(56) References Cited

U.S. PATENT DOCUMENTS

| 5,918,153 | A | 6/1999 | Morgan |
| 6,114,221 | A | 9/2000 | Tonti et al. |
| 6,255,724 | B1 | 7/2001 | Ambrosy et al. |
| 7,868,448 | B2 * | 1/2011 | Metzger ........................ 257/698 |
| 2003/0113067 | A1 * | 6/2003 | Koh et al. ........................ 385/48 |
| 2006/0267178 | A1 * | 11/2006 | Metzger ........................ 257/698 |
| 2007/0114643 | A1 * | 5/2007 | DCamp et al. ................ 257/678 |
| 2007/0139604 | A1 * | 6/2007 | Paik et al. ..................... 349/156 |

* cited by examiner

*Primary Examiner* — Mamadou Diallo
(74) *Attorney, Agent, or Firm* — Altera Law Group, LLC (57) ABSTRACT

The wafer arrangement (100) provided comprises a first wafer (101), which comprises an integrated circuit and a recess (105). The wafer arrangement further comprises a portion of a second wafer (103), which comprises a carrier portion and a protrusion (107), the protrusion comprising an active component or actively controlled component (109) such as a MEMS component, wherein the portion of the second wafer (103) is coupled to the first wafer (101) such that the protrusion (107) is received in the recess (105). The invention provides a mechanism for accurately aligning an active component (109) on the second wafer (103) with components on the first wafer (101), such as photonic, electronic or optical components.

20 Claims, 10 Drawing Sheets

ately controlled component, and wherein the portion of the second
wafer is coupled to the first wafer such that the protrusion is
received in the recess.

WAFER ARRANGEMENT AND A METHOD FOR MANUFACTURING THE WAFER ARRANGEMENT

The present application claims the benefit of U.S. provisional application 60/945,660 (filed on 22 Jun. 2007), the entire contents of which are incorporated herein by reference for all purposes.

FIELD OF THE INVENTION

Embodiments of the invention relate to the field of semiconductor arrangements. By way of example, embodiments of the invention relate to a wafer arrangement and a method for manufacturing the wafer arrangement.

BACKGROUND OF THE INVENTION

With the advancement of semiconductor manufacturing technology, it is now possible to fabricate electro-mechanical components on semiconductor wafers—this new area of technology is often referred to as micro-electro-mechanical systems (MEMS).

Presently, MEMS components are typically fabricated using two conventional approaches. The first conventional approach uses only one wafer, wherein the electro-mechanical components and the electronic circuit components are fabricated on the same wafer. In this regard, the electro-mechanical components are fabricated using post integrated circuit (IC) processes.

A typical problem faced when using this first approach is that active components (such as electronic, optical or optical-electronic (EO)) are usually fabricated within thin wafers (typically less than 1 micrometer ($\mu m$)), whereas MEMS components (such as mirrors) are usually fabricated within thick structured wafers (typically larger than $10\,\mu m$). As such, it is difficult to align the active components and the MEMS components on the same plane.

The second conventional approach uses two wafers, wherein the MEMS components and the active components may be fabricated on different wafers. Subsequently, the two wafers are integrated together by a wafer-to-wafer bonding process.

In this second approach where two wafers are used, the x-axis and y-axis alignments between the two wafers depend largely on the accuracy of the wafer-to-wafer bonding process. This means that a low accuracy of the wafer-to-wafer bonding process would result in a poor alignment between the active components and the MEMS components on the two wafers. Further, since the components on a first wafer and the components on a second wafer are on different planes, it is difficult to achieve accurate alignment along the x-axis, the y-axis and the z-axis as well.

A solution to overcome the alignment related problems involved with the fabrication of MEMS components on semiconductor wafers is the wafer arrangement and the method for manufacturing the wafer arrangement, as defined in the respective independent claims of the present application.

SUMMARY OF THE INVENTION

In an embodiment of the invention, a wafer arrangement is provided. The wafer arrangement provided may include a first wafer, wherein the first wafer includes an integrated circuit and a recess. The wafer arrangement provided further includes a portion of a second wafer, wherein the portion of the second wafer includes a carrier portion, and a protrusion, the protrusion includes an active component or an actively controlled component, and wherein the portion of the second wafer is coupled to the first wafer such that the protrusion is received in the recess.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 (*a*)-(*g*) shows different stages of the method for manufacturing the wafer arrangement according to one embodiment of the invention.

FIG. 4 (*a*)-(*c*) shows a set of photographs of the structures implemented on the first wafer of the wafer arrangement according to one embodiment of the invention.

FIG. 7 (*a*)-(*c*) shows a set of photographs of the fabricated structures on semiconductor wafers, according to one embodiment of the invention.

DETAILED DESCRIPTION OF THE INVENTION

In an embodiment of the invention, the wafer arrangement provided may be formed by two wafers, with the first wafer having a recess and the second wafer having a protrusion.

With the protrusion of the second wafer being received in the recess of the first wafer, this may provide an elegant way to align the two wafers before the process of wafer-to-wafer bonding is performed subsequently.

In one embodiment, before the wafer-to-wafer bonding process, the second wafer may have only the protrusion, but no MEMS components. The MEMS components are fabricated on the second wafer only after performing the wafer-to-wafer bonding process.

As used herein, the term 'wafer' may refer to a thin slice of semiconductor material (for example, silicon (Si) crystal), upon which micro-circuits may be fabricated using the various semiconductor processes, such as ion implantation, chemical etching, and deposition of various materials.

In another embodiment of the invention, a method for manufacturing a wafer arrangement is provided. The method provided includes forming a recess in a first wafer, wherein the first wafer includes an integrated circuit, and forming a protrusion on a second wafer. The method provided further includes coupling the second wafer to the first wafer such that the protrusion is received in the recess, and forming an active component or an actively controlled component in the protrusion.

According to one embodiment of the invention, the first wafer is a silicon wafer. According to another embodiment of the invention, the first wafer is a silicon-on-insulator wafer.

According to one embodiment of the invention, the integrated circuit includes a control circuit to control the active component or the actively controlled component. According to another embodiment of the invention, the control circuit includes an electronic control circuit or a photonic control circuit.

According to one embodiment of the invention, the first wafer further includes a photonic device. According to another embodiment of the invention, the photonic device is a photonic device selected from a group of photonic devices consisting of a waveguide structure, a laser component, a mirror, a modulator, a photo-detector, a wavelength converter, and an amplifier.

According to one embodiment of the invention, the first wafer further includes a further recess. According to another embodiment of the invention, the further recess is configured to receive an optical component.

In this embodiment, an optical component may be, but is not limited to, a ball lens, a laser diode and a fiber, for example.

According to one embodiment of the invention, the wafer arrangement provided further includes an optical component arranged in the further recess of the first wafer.

According to one embodiment of the invention, the second wafer is a silicon wafer. According to another embodiment of the invention, the second wafer is a silicon-on-insulator wafer.

According to one embodiment of the invention, the carrier portion is a thinned portion of the second wafer.

According to one embodiment of the invention, the active component or the actively controlled component is a micro-electro-mechanical system component. According to another embodiment of the invention, the micro-electro-mechanical system component is a micro-electro-mechanical system component selected from a group of micro-electro-mechanical system components consisting of a mirror, a grating, a switch, and a cantilever structure.

According to one embodiment of the invention, the recess has a depth in the range from about 1 μm to about 500 μm.

According to one embodiment of the invention, the protrusion protrudes from the surface of the second wafer by about 1 μm to about 500 μm.

According to one embodiment of the invention, the portion of the second wafer is wafer bonded to the first wafer such that the protrusion is received in the recess.

According to one embodiment of the invention, the method provided further includes forming the integrated circuit as a control circuit to control the active component or the actively controlled component.

According to one embodiment of the invention, the method provided further includes arranging a photonic device on the first wafer.

According to one embodiment of the invention, the method provided further includes forming a further recess in the first wafer. In one embodiment, the further recess is formed to receive an optical component. In another embodiment, the method provided further includes arranging an optical component in the further recess of the first wafer.

According to one embodiment of the invention, the method provided further includes thinning at least a portion of the second wafer.

According to one embodiment of the invention, the method provided further includes forming the active component or the actively controlled component as a micro-electro-mechanical system component.

The embodiments which are described in the context of the wafer arrangement provided are analogously valid for the method for manufacturing the wafer arrangement, and vice versa.

Figure 1:
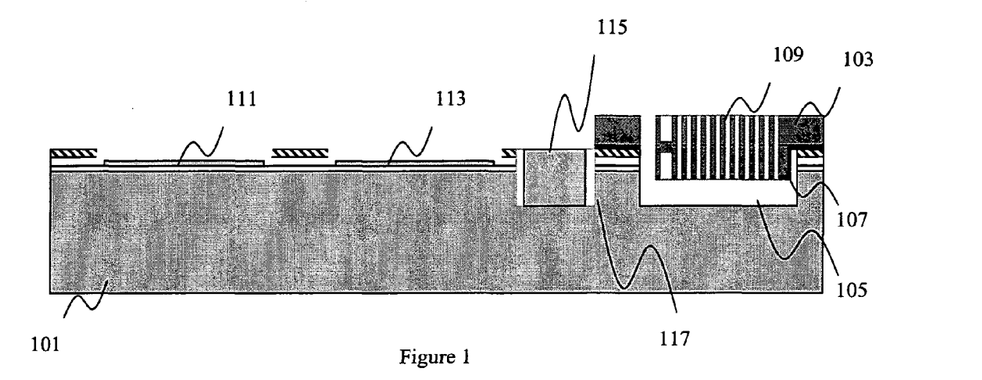
FIG. 1 shows a wafer arrangement according to one embodiment of the invention.

FIG. 1 shows a wafer arrangement 100 according to one embodiment of the invention.

The wafer arrangement 100 includes a first wafer 101 and a second wafer 103, which been bonded together through a wafer-to-wafer bonding process.

In an embodiment of the invention, the first wafer 101 and/or the second wafer 103 may be made of semiconductor materials of various types, including silicon, germanium, Group III to V or other types, including polymers, for example, although in another embodiment of the invention, other suitable materials can also be used. In an exemplary embodiment of the invention, the first wafer 101 and/or the second wafer 103 may be made of silicon (doped or undoped), in an alternative embodiment of the invention, the first wafer 101 and/or the second wafer 103 are/is a silicon on insulator (SOI) wafer. As an alternative, any other suitable semiconductor materials can be used for the first wafer 101 and/or the second wafer 103, for example semiconductor compound material such as gallium arsenide (GaAs), indium phosphide (InP), but also any suitable ternary semiconductor compound material or quaternary semiconductor compound material such as indium gallium arsenide (InGaAs).

In an embodiment of the invention, the first wafer 101 includes a recess 105, and the second wafer 103 includes a protrusion 107, where the protrusion 107 of the second wafer 103 is received in the recess 105 of the first wafer 101, in order to properly align the first wafer 101 with the second wafer 103 before the wafer-to-wafer bonding process is performed.

After the wafer-to-wafer bonding process is performed, additional components may then be fabricated.

For example, the MEMS component 109 (such as a mirror, for example) may be fabricated on the second wafer 103 on the area on which the protrusion 107 is fabricated. As MEMS components are typically fabricated within thick structured wafers, the combined thickness of the second wafer 103 together with the protrusion 107 makes the area of the second wafer on which the protrusion is fabricated suitable for fabricating MEMS components.

Additionally, other components, such as control electronic components 111 and silicon (Si)-photonic components 113, may also be fabricated on the first wafer 101.

Further, an optical component 115 may also be fabricated on the first wafer 101 in a further recess 117. An optical component may be larger than typical electronic or photonic components. Therefore, in order to prevent the optical component from protruding out unnecessarily from the surface of the wafer arrangement, the optical component may be fabricated in a recess instead, such as the further recess 117, for example.

FIG. 2 (a)-(g) shows different stages of the method for manufacturing the wafer arrangement according to one embodiment of the invention.

FIG. 2 (a) shows two clean wafers, the first wafer 201 and the second wafer 203. This is at the first stage of processing.

Figure 2A:
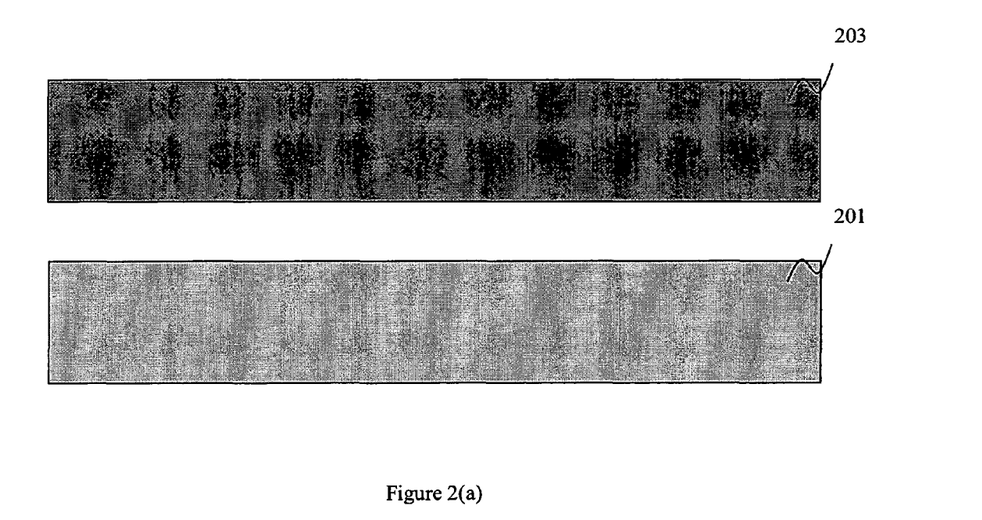

In one embodiment, the wafers 201 and 203 are silicon substrates.

FIG. 2 (b) shows the first wafer 201 and the second wafer 203, after the second stage of processing.

Figure 2B:
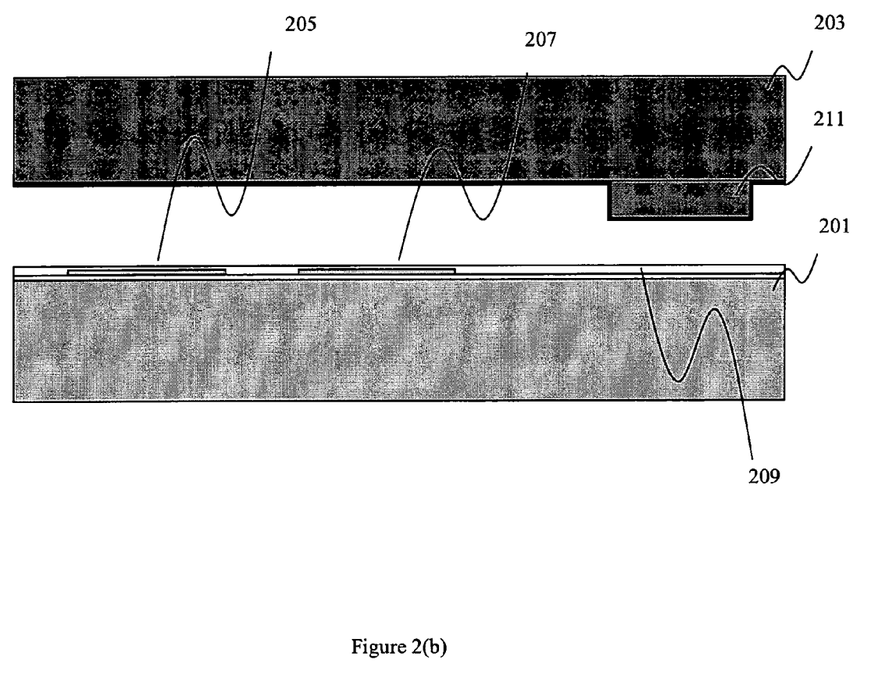

In more detail, components have been fabricated on the first wafer 201, such as control electronic components 205 and silicon (Si)-photonic components 207, for example. Further, a dielectric layer 209 has been deposited on top of the components fabricated (205 and 207) as well as the first wafer

201. In an embodiment of the invention, the control electronic components 205 may include control logic, which may be implemented as hard-wired control logic or as programmable control logic (e.g. a programmable processor, e.g. a microprocessor including complex instruction set computer (CISC) processor or reduced instruction set computer (RISC) processor). In an embodiment of the invention, the photonic components 207 include waveguides, power splitters, optical amplifiers, optical modulators, optical filters and optical sensors/detectors, for example. The dielectric layer 209 may have a layer thickness in the range from about 1 nm to about 5000 nm, e.g., a layer thickness in the range from about 50 nm to about 1000 nm.

Further, an Si-island structure (or protrusion) 211 is also constructed on the second wafer 203. For example, the Si-island structure may be constructed by patterning and then selectively etching the second wafer 203. In an embodiment of the invention, the protrusion 211 may have a height in the range from about 1 μm to about 500 μm, e.g., in the range from about 30 μm to about 100 μm, seen from the upper surface of the second wafer 203.

FIG. 2 (*c*) shows the first wafer 201 and the second wafer 203, after the third stage of processing.

Figure 2C:
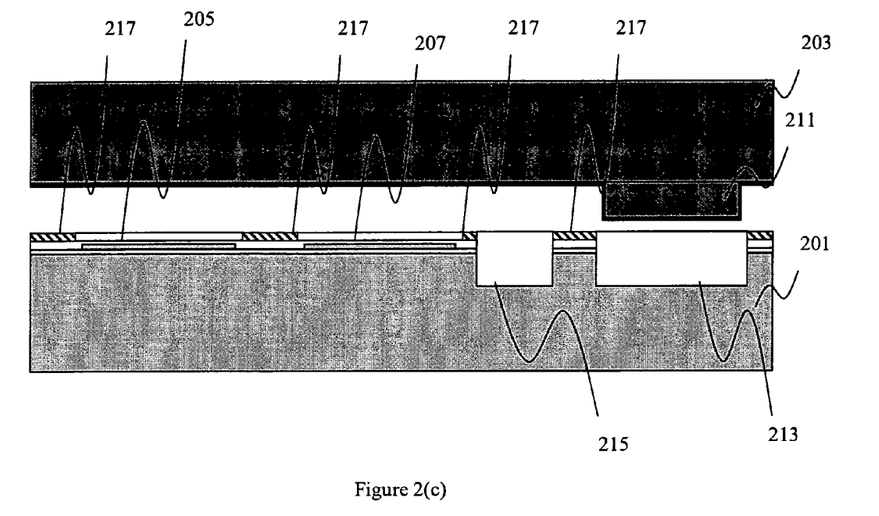
Figure 2D:
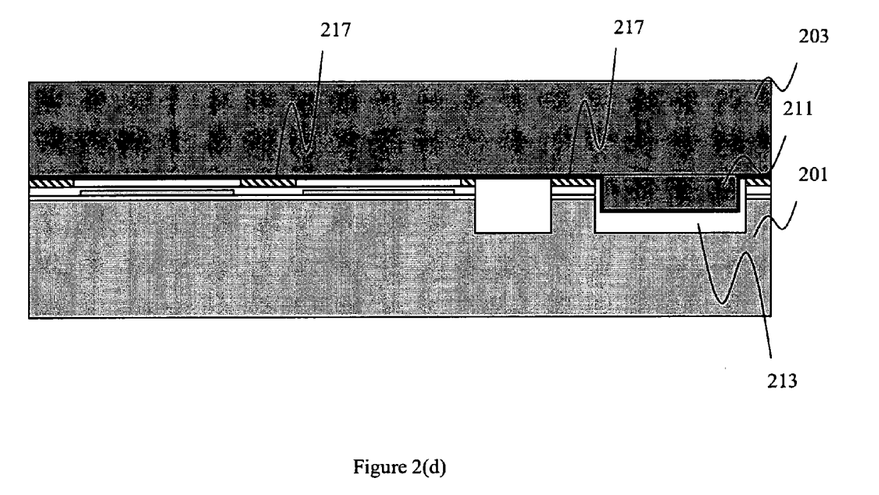

In more detail, a recess 213 has been fabricated on the first wafer 201, such that it is suitable to receive the Si-island structure protrusion 211 of the second wafer 203, in order to facilitate the alignment of the first wafer 201 with the second wafer 203 for the subsequent wafer-to-wafer bonding process. The recess 213 may have a depth in the range from about 1 μm to about 500 μm, e.g., in the range from about 5 μm to about 200 μm, seen from the upper surface of the first wafer 201.

Additionally, a further recess 215 may also be fabricated. The further recess 215 may have a depth in the range from about 1 μm to about 500 μm, e.g. in the range from about 5 μm to about 200 μm, seen from the upper surface of the first wafer 201.

Subsequently, an intermediate bonding layer 217 may be patterned and deposited accordingly onto the first wafer 201. The intermediate bonding layer may be, but is not limited to, a benzocyclobutene (BCB) layer, a metal bonding layer (for example, Au/Sn), a solder layer and a glass bonding layer (for example, Fritt glass), for example.

In one embodiment, during the wafer-to-wafer bonding process, the temperature of the wafer arrangement of FIG. 2 (*c*) may be increased to about 100-400° C. At this temperature, the wafer-to-wafer bonding may be achieved without damage to the components already fabricated on the first wafer 201, such as the control electronic components 205 and the silicon (Si)-photonic components 207.

FIG. 2 (*d*) shows the first wafer 201 and the second wafer 203, after the fourth stage of processing, wherein the wafer-to-wafer bonding process has been completed.

As shown in FIG. 2 (*d*), with the Si-island structure protrusion 211 of the second wafer 203 being received in the recess 213 of the second wafer 203, the alignment of the first wafer 201 with the second wafer 203 may be accurately achieved.

As a side remark, it should be noted that subsequent processing on the wafer arrangement may affect both the first wafer 201 and the second wafer 203, now that they have been bonded together.

FIG. 2 (*e*) shows the first wafer 201 and the second wafer 203, after the fifth stage of processing.

Figure 2E:
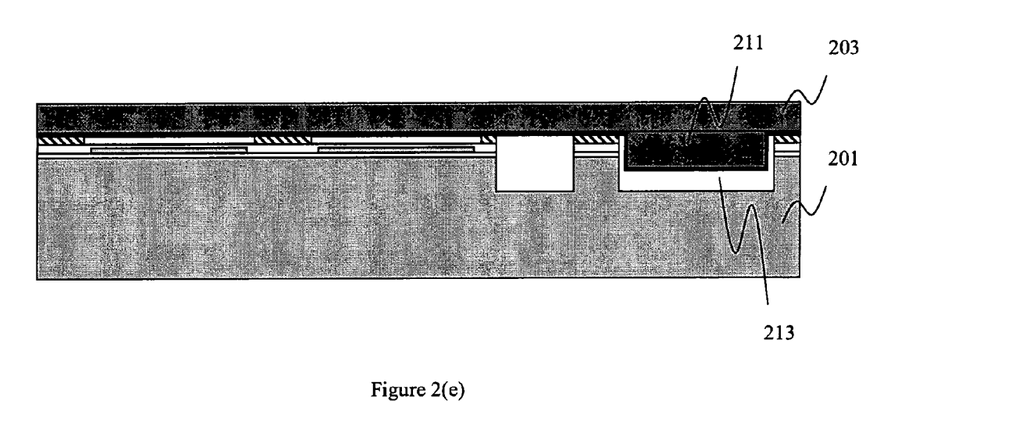

In this stage of processing, the second wafer 203 is thinned down, using a mechanical grinding and polishing process, for example. In an embodiment of the invention, the second wafer 203 is thinned to a thickness in the range from about 1 μm to about 500 μm, e.g., to a thickness in the range from about 30 μm to about 100 μm.

FIG. 2 (*f*) shows the first wafer 201 and the second wafer 203, after the sixth stage of processing.

Figure 2F:
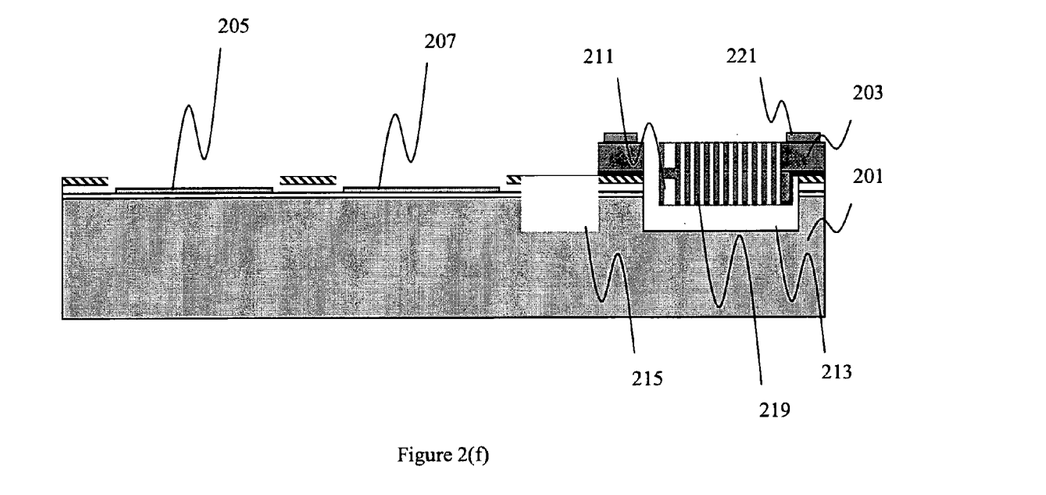

In this stage of processing, the second wafer 203 is patterned and selectively etched away, especially over the areas on the first wafer 201 where components have been fabricated (for example, 205 and 207) and the further recess 215.

Additionally, the MEMS component 219 (which may be a mirror or an actuator, for example) may be fabricated on the area of the second wafer 203 over the Si-island structure protrusion 211, by patterning and deep silicon etching, using the deep reactive ion etching (DRIE) process, for example.

Further, it should be noted that a metal pad 221 may be fabricated either before or after the MEMS component fabrication.

FIG. 2 (*g*) shows the first wafer 201 and the second wafer 203, after the seventh stage of processing.

Figure 2G:
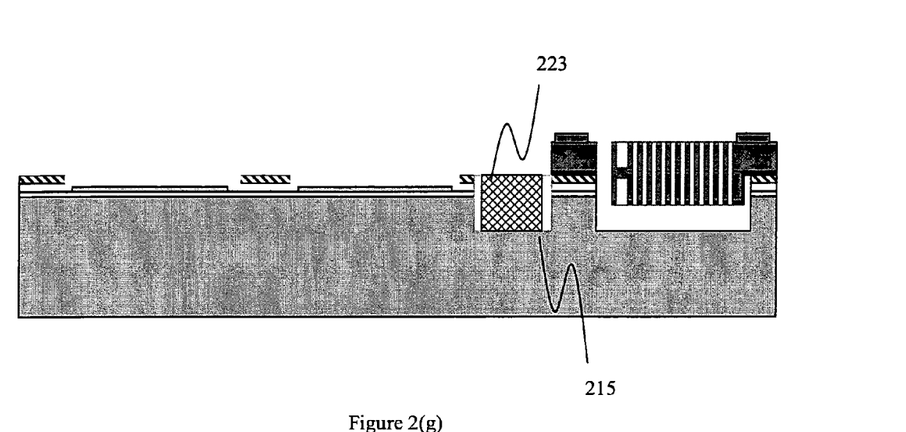

In this stage of processing, additional components may be fabricated and assembled on the wafer arrangement. For example, an optical component 223 may be fabricated in the further recess area 215 of the first wafer 201.

Figure 3:
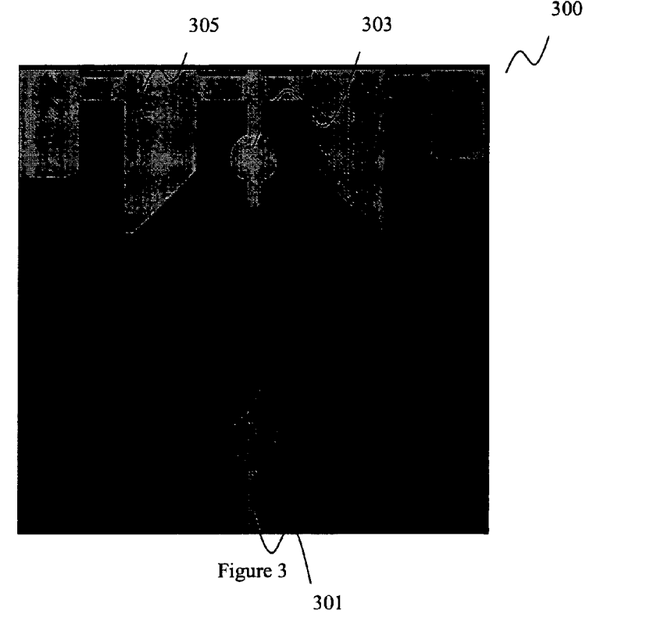
FIG. 3 shows a photograph of the layout of the fiber trench, the ball lens trench and the recess for the MEMS structure on the first wafer of the wafer arrangement, according to one embodiment of the invention.

FIG. 3 shows a photograph 300 of the layout of the fiber trench 301, the ball lens trench 303 and the recess 305 for the MEMS structure on the first wafer of the wafer arrangement, according to an embodiment of the invention.

Figure 4:
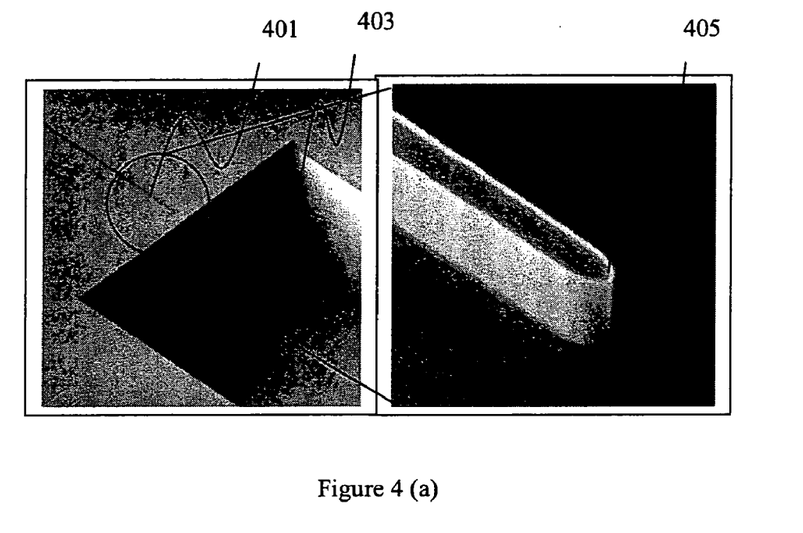

FIG. 4 (*a*)-(*c*) shows a set of photographs of the structures implemented on the first wafer of the wafer arrangement according to one embodiment of the invention.

FIG. 4 (*a*) shows a photograph on the structures fabricated on the first wafer (including a waveguide 401 and a fiber trench 403) and a correspondingly enlarged photograph of the tip 405 of the waveguide 401, which has a roughly 90° sidewall and a roughness of about 5 nm on the sidewall.

FIG. 4 (*b*) shows a photograph (from a top-down point of view) on the structures fabricated on the first wafer, including a waveguide 401, a fiber trench 403 and the ball lens trench 407.

FIG. 4 (*c*) shows a photograph on the structures fabricated on the first wafer, including the vertical sidewall 409 of the fiber trench 403 and the vertical sidewall 411 of the ball lens trench 407.

Figure 5:
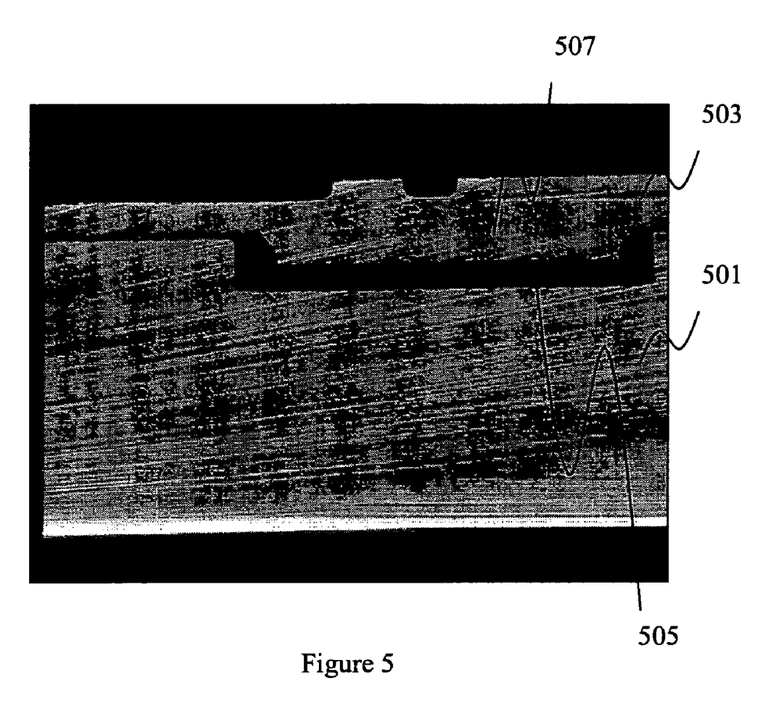
FIG. 5 shows a photograph (from a cross-sectional point of view) of a wafer arrangement implemented according to one embodiment of the invention.

FIG. 5 shows a photograph (from a cross-sectional point of view) of a wafer arrangement implemented according to one embodiment of the invention.

The wafer arrangement shown in FIG. 5 includes the first wafer 501 and the second wafer 503. The first wafer 501 includes a recess 505 and the second wafer 503 includes a protrusion 507, where the protrusion 507 of the second wafer 503 is received in the recess 505 of the first wafer 501.

In this photograph, it can be seen that the second wafer 503 has been partially etched and thinned.

Further, in this wafer arrangement implementation, the depth of the recess 505 is about 100 μm and the height of the protrusion 507 is about 65 μm.

Additionally, the tolerance on the alignment of the wafers may be as large as 20 μm. This tolerance is larger than the alignment accuracy provided by presently available wafer bonding equipment (which performs the wafer bonding process) of 5 μm in both the x-direction and the y-direction.

Figure 6:
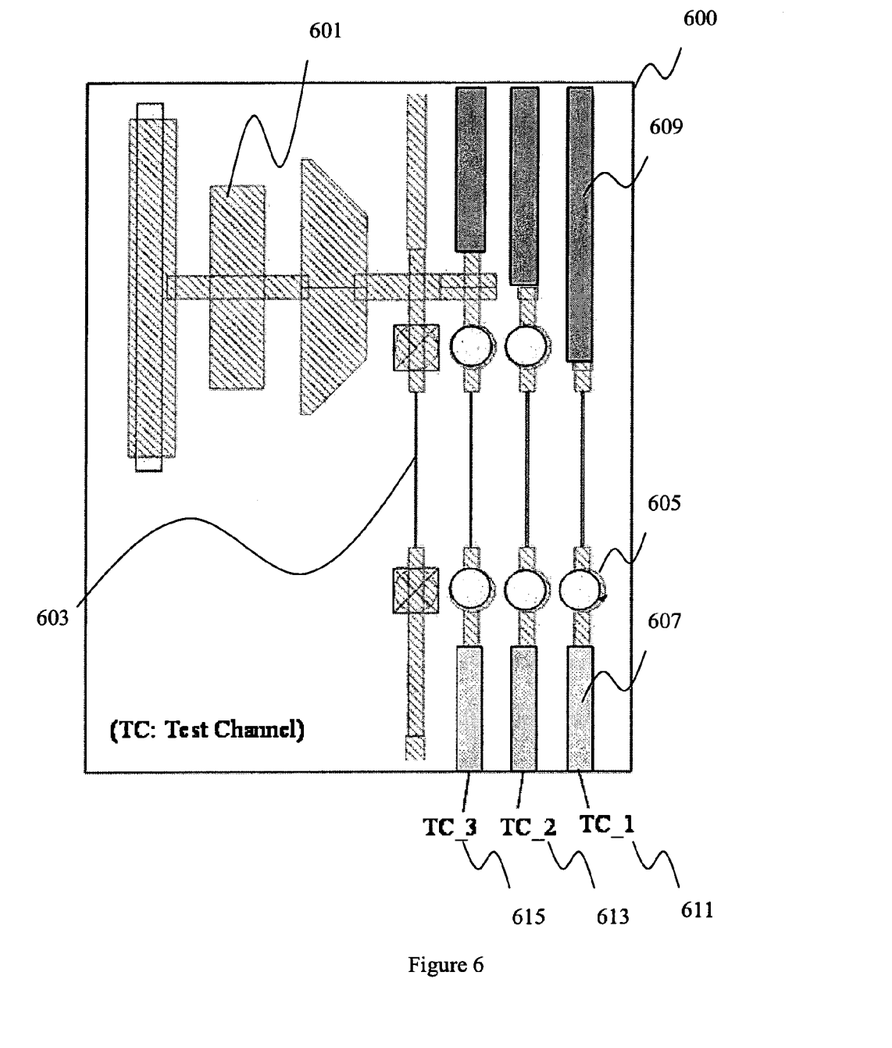
FIG. 6 shows a diagram illustrating the test set-up for the wafer arrangement implemented according to one embodiment of the invention.

FIG. 6 shows a diagram illustrating the test set-up for the wafer arrangement 600 implemented according to one embodiment of the invention.

The wafer arrangement 600 includes fabricated components such as the MEMS component 601 and the waveguide 603. Additionally, the wafer arrangement further includes the ball lens assembly 605 where the ball lens are arranged accordingly in the ball lens trenches, the single mode fiber (SMF) assembly 607 where the single mode fibers (SMF) are arranged accordingly in the corresponding fiber trenches, and the multi mode fiber (MMF) assembly 609 where the multi mode fibers (MMF) are arranged accordingly in the corresponding fiber trenches.

Subsequently, the single mode fibers (SMF) of the single mode fiber (SMF) assembly 607 are connected to a laser source while the multi mode fibers (MMF) of the multi mode fiber (MMF) assembly 609 are connected to respective detectors, in order to measure the insertion loss for each test channel. In this regard, there are 3 test channels in this wafer arrangement, Test Channel 1 (TC_1) 611, Test Channel 2 (TC_2) 613 and Test Channel 3 (TC_3) 615.

From the measurements made, it was found that the insertion loss at Test Channel 1 (TC_1) 611, Test Channel 2 (TC_2) 613 and Test Channel 3 (TC_3) 615 respectively are about 2.4 dB, 17.1 dB and 22.9 dB. These results indicate that optical beams may be guided through the wafer arrangement implemented according one embodiment of the invention.

Figure 7:
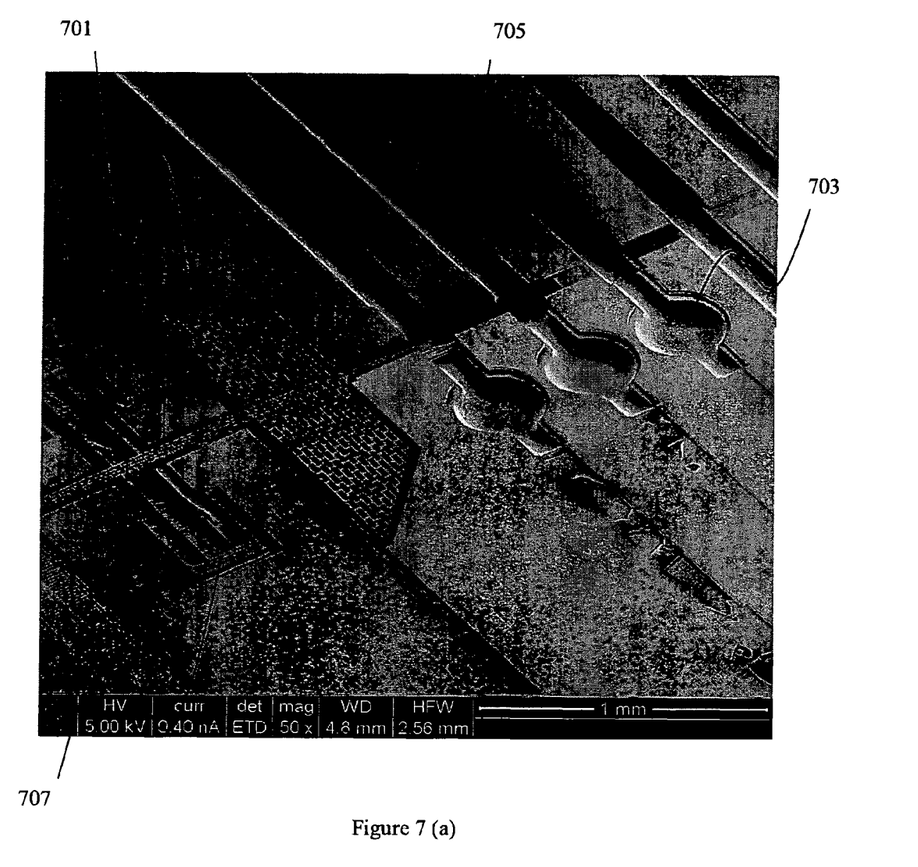

FIG. 7 (a)-(c) shows a set of photographs of the fabricated structures on semiconductor wafers, according to one embodiment of the invention.

FIG. 7 (a) shows a MEMS structure 701, a ball lens trench 703, a fiber trench 705 and a folder beam 707. It can be seen that the MEMS structure 701 is a net structure.

FIG. 7 (b) is an enlarged photograph of the MEMS structure. It can be seen from FIG. 7 (b) that the MEMS structure 701 is suspended on top of a recess 709.

FIG. 7 (c) shows an enlarged photograph of the structures around the fiber trench 705, in particular the optical mirror 711. The further enlarged photograph of the area 713 shows another recess 715, the thick Si layer 717 and the thin Si layer 719.

Embodiments of the invention have the following effect.

As shown by the embodiments of the invention described earlier, the provision of a recess on a first wafer and a protrusion on a second wafer wherein the recess of the first wafer receives the protrusion of the second wafer, allows the first wafer to be aligned with the second wafer in an elegant manner, before a wafer-to-wafer bonding process is performed on the wafer arrangement consisting of the first wafer and the second wafer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A wafer arrangement, comprising:
    a first wafer, the first wafer comprising:
        an integrated circuit;
        a recess;
    a portion of a second wafer, the portion of the second wafer comprising:
        a carrier portion;
        a silicon island structure protrusion, the protrusion comprising an active component or an actively controlled component;
    wherein the portion of the second wafer is coupled to the first wafer such that the protrusion is received in the recess.

2. The wafer arrangement of claim 1, wherein the first wafer is a silicon wafer.

3. The wafer arrangement of claim 1, wherein the first wafer is a silicon-on-insulator wafer.

4. The wafer arrangement of claim 1, wherein the integrated circuit comprises a control circuit to control the active component or the actively controlled component.

5. The wafer arrangement of claim 4, wherein the control circuit comprises an electronic control circuit or a photonic control circuit.

6. The wafer arrangement of claim 1, wherein the first wafer further comprises a photonic device.

7. The wafer arrangement of claim 6, wherein the photonic device is a photonic device selected from a group of photonic devices consisting of:
    a waveguide structure,
    a laser component,
    a mirror,
    a modulator,
    a photo-detector,
    a wavelength converter, and
    an amplifier.

8. The wafer arrangement of claim 1, wherein the first wafer further comprises a further recess.

9. The wafer arrangement of claim 8, wherein the further recess is configured to receive an optical component.

10. The wafer arrangement of claim 9, further comprising:
    an optical component arranged in the further recess of the first wafer.

11. The wafer arrangement of claim 1, wherein the second wafer is a silicon wafer.

12. The wafer arrangement of claim 1, wherein the second wafer is a silicon-on-insulator wafer.

13. The wafer arrangement of claim 1, wherein the carrier portion is a thinned portion of the second wafer.

14. The wafer arrangement of claim 1, wherein the active component or the actively controlled component is a micro-electro-mechanical system component.

15. The wafer arrangement of claim 14, wherein the micro-electro-mechanical system component is a micro-electro-mechanical system component selected from a group of micro-electro-mechanical system components consisting of:
    a mirror,
    a grating,
    a switch, and
    a cantilever structure.

16. The wafer arrangement of claim 1, wherein the recess has a depth in the range from about 1 μm to about 500 μm.

17. The wafer arrangement of claim 1, wherein the protrusion protrudes from the surface of the second wafer by about 1 μm to about 500 μm.

18. The wafer arrangement of claim 1, wherein the portion of the second wafer is wafer bonded to the first wafer such that the protrusion is received in the recess.

19. A method for manufacturing a wafer arrangement, the method comprising:
    forming a recess in a first wafer, wherein the first wafer includes an integrated circuit;
    forming a silicon island structure protrusion on a second wafer;
    coupling the second wafer to the first wafer such that the protrusion is received in the recess;
    forming an active component or an actively controlled component in the protrusion.

20. The method of claim 19, wherein the first wafer is a silicon wafer.

* * * * *